United States Patent [19]

Zwicker et al.

[11] Patent Number: 4,722,695

[45] Date of Patent: Feb. 2, 1988

[54] PRESSURIZED WATER-PROOF CONNECTION FOR AN ELECTRICAL CABLE

[75] Inventors: Wolfgang Zwicker, Olpe; Alfons Motsch, Wiehl, both of Fed. Rep. of Germany

[73] Assignee: Zwicker & Hensel Elektronische Schalttechnik, Olpe, Fed. Rep. of Germany

[21] Appl. No.: 862,630

[22] Filed: May 13, 1986

[51] Int. Cl.⁴ .................................................. H01R 13/52
[52] U.S. Cl. .................................................. 439/275
[58] Field of Search ............... 339/14 R, 94 R, 94 A, 339/94 C, 94 L, 94 M, 113 L; 174/51; 439/275

[56] References Cited

U.S. PATENT DOCUMENTS

| | | | |
|---|---|---|---|
| 3,444,505 | 5/1969 | Becker | 339/94 M |
| 3,567,843 | 3/1971 | Collins et al. | 174/51 |
| 4,020,308 | 4/1977 | Edwards, Jr. et al. | 339/113 L X |

*Primary Examiner*—Z. R. Bilinsky
*Attorney, Agent, or Firm*—Bacon & Thomas

[57] ABSTRACT

A pressurized water-proof connection for connecting an electrical cable to a housing of an electrical sensor is disclosed. An intermediate housing for connecting the electrical sensor contains a coupling piece electrically connected to the sensor with contact elements and a collar having an internal thread and with coupling sleeves directed in the axial direction of said collar. A plug with contact elements connected to electrical wires of an electrical cable is insertable through the collar. A closure sleeve has a thread portion for the internal thread of the collar and also a thread for a screw-type cable fitting for the electrical cable.

11 Claims, 3 Drawing Figures

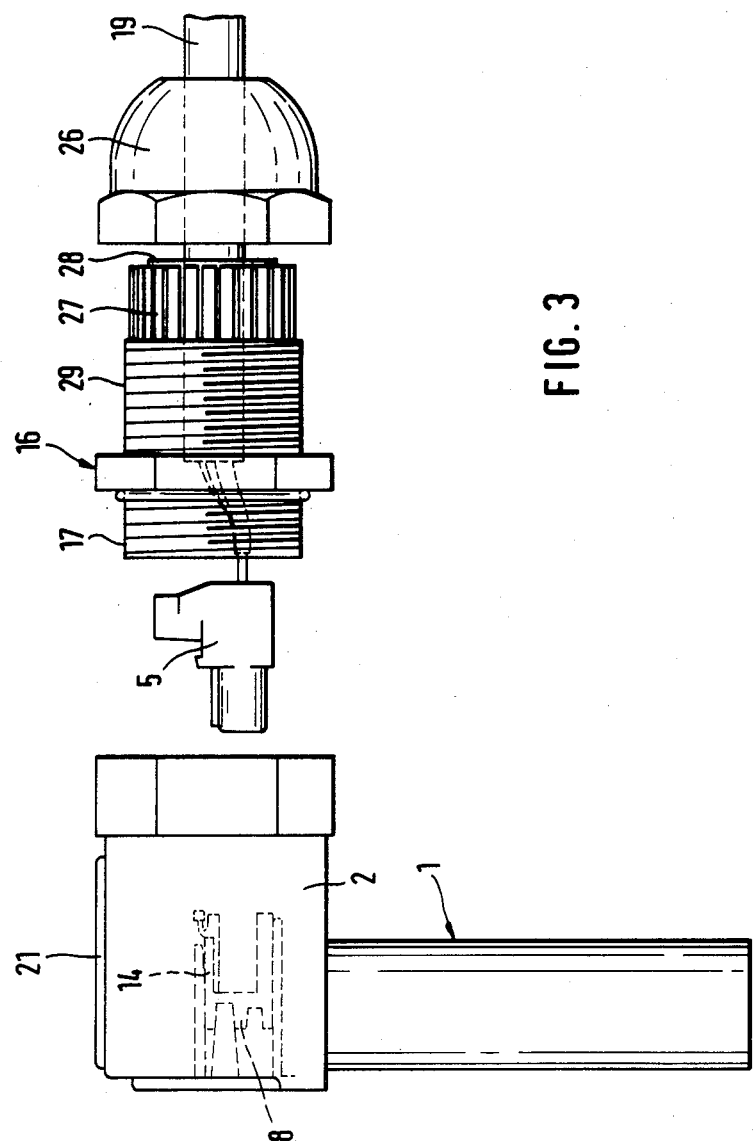

PRESSURIZED WATER-PROOF CONNECTION FOR AN ELECTRICAL CABLE

BACKGROUND OF THE INVENTION

1. FIELD OF THE INVENTION

The invention relates to a pressurized water-proof connection for connecting an electrical cable to a housing of an electrical sensor.

2. DESCRIPTION OF THE PRIOR ART

Electrical sensors such as approximation switches for a contactfree signal are provided as initiators for maintenance-free function and are utilized inter alia in the general mechanical engineering, e.g. for transfer trains in the automobile industry. Due to their high resistance to wear, the permanent constancy of the switching points, the high switching frequency, and the recognition of metal parts of any shape and of any guidance even in case of unfavourable installation conditions such switches are an economical alternative to electromechanical limit switches. According to the DIN standards such limit switches are to be protected against the intrusion of dust and water.

There are known limit switches working as initiators having in an intermediate housing a clamping chamber for an electrical cable which is lockable by a sealed cover, mounted on the intermediate housing by means of screws and containing terminals for the connecting of the wires of an electrical cable which is introduced via a moisture-proof screw-type cable fitting consisting of plastic material with soft-rubber packings into the clamping space of the intermediate housing. Screw clamps are used to connect the wires of the elctrical cable to the limit switch, the screws of which, after opening the cover of the intermediate housing, can be released and tightened by a screw driver.

Often it is necessary to install limit switches in positions difficult to access so that the clamping of the electrical cable is difficult and relatively time-consuming for initial installation and for replacing defective switches. Thus, the exchange of a defective limit switch, e.g. on a transfer train for the automobile production may lead to an undesired loss of productivity by the necessary shutdown of the train.

SUMMARY OF THE INVENTION

One object of the invention is to provide, in a very confined space, a pressurized water-proof connection for electrical sensors, particularly approximation switches, which renders possible a simple and quick attachment of an electrical cable. This object is solved by a connector apparatus for connecting an electrical cable to an electrical sensor comprising:

an intermediate housing for connecting to an electrical sensor said housing containing a coupling piece which is electrically connectable to the sensor with contact elements, a collar having an internal thread, and coupling sleeves disposed in the axial direction of said collar;

a plug with contact elements connectable to electrical wires of an electrical cable, said plug being insertable through said collar; and a closure sleeve having a threaded portion for engaging the internal thread of said collar and having a screw-type cable fitting for an electrical cable.

A further object provides a safe electrical contact in that the contact elements of the plug are provided as sleeves and the contact elements of the coupling piece are provided as pins, and vice versa.

A further object provides that the plug comprises spring clamps as contact elements for the electrical cable.

An alternative object provides that the contact elements of the plug for the electrical cable are provided as screw-clamps.

A fixation of the coupling piece is achieved in that the U-shaped housing of the coupling piece, formed as a push-in part, is situated in two upper and lower lateral guides and with its rear side on a holder in the intermediate housing and is secured against loosening by a pretensionned spring leg, which springs off behind two stop noses, arranged oppositely on the inner wall of the connection housing, when pushing into the guides, in the intermediate housing.

A pressurized water-proof connection of the cable is achieved by a safety device of the plug against loosening from the coupling piece by means of a closure sleeve, on which the cable fitting for the electrical cable is screwed.

A reliable constructional design is achieved in that connection housing, plug, and coupling piece consist of plastic material.

BRIEF DESCRIPTION OF THE DRAWINGS

One embodiment of the invention is explained in the following description with regard to the accompanying drawings which show FIG. 1 a longitudinal section of the connection, according to the invention, FIG. 2 a front view of the connection housing and FIG. 3 an exploded illustration of the connection.

DESCRIPTION OF THE PREFERRED EMBODIMENT

Figure 1:
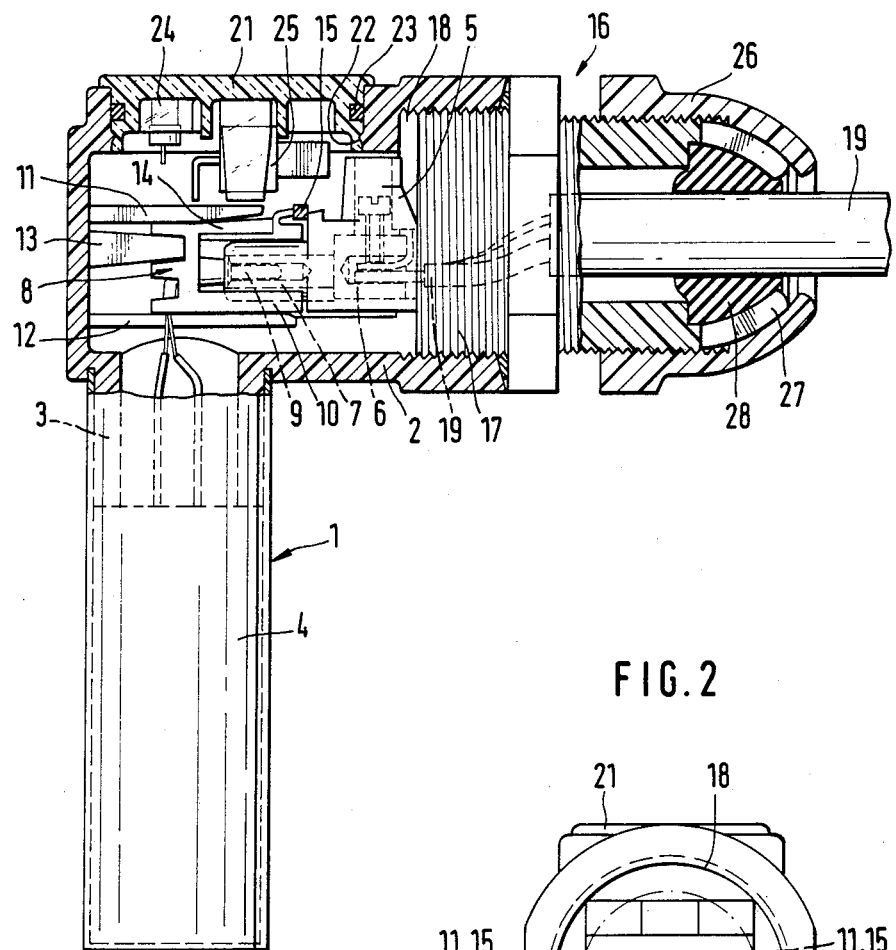
Figure 2:
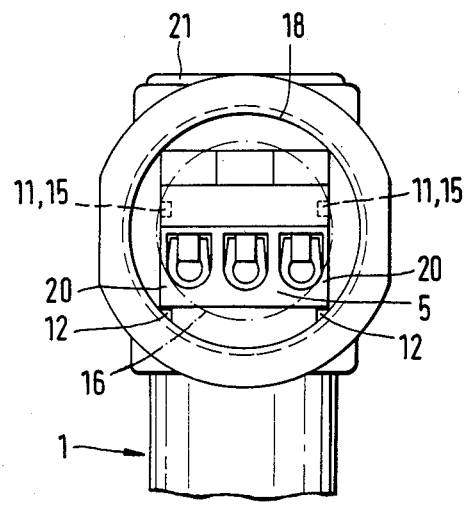

The pressurized water-proof connection for an electrical sensor, e.g. an approximation switch 1 for a contact-free signal, comprises as main components an intermediate housing 2, consisting of plastic material and having a connection sleeve 3, on which the housing 4 of the approximation switch 1 is pressed. In addition a plug 5 of plastic material, removable from the intermediate housing 2 or insertable into such housing, respectively, is provided which plug is equipped with cable clamps 6 for an external source of voltage and control circuits, and plug-in contacts 7, as well as an exchangeable coupling piece 8, inserted into the intermediate housing 2 and consisting of plastic material with cooperating contact elements 9 for the plug 5, which coupling piece 8 is electrically connected to the approximation switch 1.

The plug-in contacts 7 of the plug 5 are provided as sleeves, and the cooperating contact elements 9 of the coupling piece 8 are provided as pins.

Differing from the embodiment of the invention as described, as plug-in contacts 7 of the plug 5, pins may be provided and, as cooperating contact elements 9 of the coupling piece 8, sleeves may be provided.

The cable clamps 6 of the plug 5 for a voltage source and associated circuits are provided as screw or spring clamps.

The U-shaped housing 10 of the coupling piece 8, formed as push-in part, is situated in two upper and two lower lateral guides 11, 12 and with its rear side on a holder 13 in the intermediate housing 2, and is secured, against loosening, by a resiliently pretensionned spring leg 14, which springs off behind two stop noses 15, arranged oppositely on the inner wall of the intermediate housing 2, when pushing in the coupling piece 8 into the guides 11, 12.

A thread portion 17 of a closure sleeve 16 may be screwed into the collar 18, provided with an internal thread, of the intermediate housing 2, and abuts against the front faces 20 of the plug 5 so that the same is secured against loosening from the coupling piece 8 and, thus, in case of external shocks and possibly occuring vibrations a reliable electrical connection between the push-in plug 5 and the coupling piece 8 is guaranteed. The closure sleeve 16 has further an external thread 29. The closure sleeve 16 terminates in a ring of resilient axial tongues 27 which enclose a tightening ring 28.

The cable fitting 26 has an internal thread and a conical inner surface for tensioning the tongues 27 in radial direction, if the cable fitting 26 is screwed onto the thread 28.

By means of the thread portion 17 and the ring-shaped cable fitting 26 the threaded collar 18 in the intermediate housing 2 is hermetically closed. Said configuration of the housing 2 enables the tightness of the elctrical connection against the intrusion of water.

The screw-type cable fitting 26 may be equipped additionally with an antikink bush for the electrical cable 19.

The approximation switch 1 is mounted on the intermediate housing 2 initially. For connection to the electrical cable 19 the cable fitting 26 is screwed off from the closure sleeve 16, thereby the tongues 27 of the pull-relief are released and the tightening ring 28 is extended. Now the cable fitting 26 can moved on the electrical cable. Thereafter the closure sleeve 16 is screwed-out from the intermediate housing 2, and the plug 5 is pulled out through the collar 19. Subsequently the wires of the electrical cable 19 are clamped in the plug 5 by means of the cable clamps 6, provided as screw or spring clamps. Then the plug 5 with the electrical cable is pushed into the intermediate housing 2 and thereby is plugged to the coupling piece 8, and the thread portion 17 of the closure sleeve 16 is screwed into the threaded collar 18 of the intermediate housing 2. Finally the cable fitting 26 is screwed on the thread 29 of the closure 17 and thereby the connection end of the electrical cable 19 is clamped tightly by means of the tightening ring 28 tensioned by the tongues 27 of the cable tension relief.

The intermediate housing 2 is closed by a detachable cover 21 of transparent plastic material, which is held in the cover opening by clamping ledges 22 and is sealed by an O-ring 23. On the inner side of the cover 21 two light indicators 24 and a switch 25 are arranged, which is adjustable for opening or closing function. By the installation of the change-over-switch 25 in the connection housing 2 a simple adaption is possible.

In case of need, after opening the cover 21, the coupling piece 8 may be pushed out from the guides 11, 12 and the stop noses 15 of the holder 13 by pressing down the resiliently provided spring leg 14 and pressing on the rear side of the housing 10.

The connection as described above eliminates the need for a separate electrical cable for the approximation switch 1, due to the fact that the electrical cable 19 of the consumer can be clamped directly on the plug 5, without an adapter plug 21. On the basis of the construction of the plug 5 with spring clamps for the connection of the consumer cable screws are not required for the installation to the approximation switch 1 so that the initial assembly of such a switch as well as the exchange of a defective switch can be carried out very quickly.

Differing from the embodiment of the invention as described, the intermediate housing 2 and the closure sleeve 16 may be produced from metal.

The connection is very favourable in price, due to the fact that the coupling piece and the plug of the plug connector are standard products. The connection enables direct-current operation as well as alternating-current operation of the approximation switch and/or of another electronical component part, respectively. In addition, it is possible to place, by the use of an appropriate adapter, approximation switches with different dimensions of their preferably cylindrical housing and/or other electronical component parts, respectively, on the intermediate housing without any difficulties. Finally, risk positions of leakage on the intermediate housing 2 are avoided.

We claim the following:

1. A pressurized water-proof connector for connecting an electrical cable to an electrical sensor comprising:
   an intermediate housing for connecting to an electrical sensor said housing containing a coupling piece which is electrically connectable to the sensor with contact elements, a collar having an internal thread, and coupling sleeves disposed in the axial direction of said collar;
   a plug with contact elements connectable to electrical wires of an electrical cable, said plug being insertable through said collar; and
   a closure sleeve having a threaded portion for engaging the internal thread of said collar and having a screw-type cable fitting for an electrical cable.

2. A connector according to claim 1, wherein the elements of the plug are provided as sleeves and the contact elements of the coupling piece are provided as pins.

3. A connector according to claim 1, wherein the plug comprises spring clamps as contact elements for the electrical cable.

4. A connector according to claim 1, wherein the contact elements of the plug for the electrical cable are provided as screw-clamps.

5. A connector according to claim 1, wherein the coupling piece comprises a U-shaped housing formed as a push-in part situated in two upper and lower lateral guides with its rear side on a holder in the intermediate housing and wherein said U-shaped housing is secured against loosening by a pretensioned spring leg, which springs off behind two stop noses, arranged oppositely on the inner wall of the U-shaped housing, when pushed into the guides.

6. A connector according to claim 1, further comprising a safety device for securing the plug against loosening from the coupling piece comprising a closure sleeve on which the cable fitting for the electrical cable is screwed.

7. A connector according to claim 1, wherein the intermediate housing is closed by a removable cover.

8. A connector according to claim 1, wherein the intermediate housing, plug, and coupling piece consist of plastic material.

9. A connector according to claim 1, wherein the intermediate housing consists of metal.

10. A connector according to claim 1, further comprising a switch inserted into the intermediate housing.

11. A connector according to claim 1, wherein the contact elements of the plug are provided as pins and the contact elements of the coupling piece are provided as sleeves.

* * * * *